United States Patent
Suzuki

[11] Patent Number: 5,983,829
[45] Date of Patent: Nov. 16, 1999

[54] MICROWAVE PLASMA ETCHING APPARATUS

[75] Inventor: Nobumasa Suzuki, Yokohama, Japan

[73] Assignee: Canon Kabushiki Kaisha, Tokyo, Japan

[21] Appl. No.: 08/739,212

[22] Filed: Oct. 29, 1996

[30] Foreign Application Priority Data

Nov. 1, 1995 [JP] Japan ................................. 7-285083

[51] Int. Cl.[6] .................................................. C23C 16/00
[52] U.S. Cl. .......................... 118/723 MW; 118/723 ME; 118/723 MR; 118/723 MA; 156/345
[58] Field of Search ...................... 118/723 R, 723 MW, 118/723 ME, 723 MR, 723 I, 723 IR, 723 E, 723 MA; 156/345; 204/298.38, 298.37, 298.16; 422/186, 186.04, 186.05, 186.29, 906; 315/111.21

[56] References Cited

U.S. PATENT DOCUMENTS

| | | | |
|---|---|---|---|
| 4,776,918 | 10/1988 | Otsubo et al. | 156/345 |
| 5,134,965 | 8/1992 | Tokuda et al. | 118/723 |
| 5,310,426 | 5/1994 | Mori | 118/723 AN |
| 5,366,586 | 11/1994 | Samukawa | 156/643 |
| 5,433,787 | 7/1995 | Suzuki et al. | 118/723 |
| 5,487,875 | 1/1996 | Suzuki | 422/186.05 |
| 5,538,699 | 7/1996 | Suzuki | 422/186.29 |
| 5,585,148 | 12/1996 | Suzuki et al. | 497/572 |

FOREIGN PATENT DOCUMENTS

| | | | |
|---|---|---|---|
| 0047663 | 3/1982 | European Pat. Off. | H01J 37/32 |
| 0593931 | 4/1994 | European Pat. Off. | H01J 37/32 |
| 5-345982 | 12/1993 | Japan . | |
| 5345982 | 12/1993 | Japan | C23C 16/50 |

*Primary Examiner*—Bruce Breneman
*Assistant Examiner*—Luz Alejandro
*Attorney, Agent, or Firm*—Fitzpatrick, Cella, Harper & Scinto

[57] ABSTRACT

A plasma process apparatus comprises a plasma process chamber, substrate-to-be-processed supporting means for supporting a substrate to be processed, provided in the process chamber, gas introducing means, gas evacuation means, microwave introducing means using an endless circular waveguide having a plurality of slots arranged around the process chamber, and radio frequency power supplying means for supplying radio frequency power to the substrate supporting means. The above arrangement permits a uniform plasma to be generated in high density and in a large area even under the low-pressure condition of about 1 mTorr without using a magnetic field, thus enabling etching of large-area substrates in super fine patterns and at high speed.

5 Claims, 2 Drawing Sheets

MICROWAVE PLASMA ETCHING APPARATUS

BACKGROUND OF THE INVENTION

1. Field of the Invention

The present invention relates to a microwave plasma process apparatus. The apparatus enables etching of large-area substrates in super fine patterns at high speed. Further, the apparatus can be applied to oxidation, nitriding, doping, cleaning, cleaning ashing, and so on.

2. Related Background Art

The reactive ion etching (RIE) apparatus for applying RF (radio frequency) power between parallel plate electrodes opposed to each other is frequently used for pattern formation in fabrication of electronic components such as ultra-large-scale integrated (ULSI) circuits.

A conventional RIE apparatus is shown in FIG. 2. In a process chamber 201 there are provided a holder 203 for a substrate 202 to be processed, and a gas introducing means 204. An RF power supply 206 is connected to the holder 203. The process chamber is evacuated by an evacuation means 205.

Etching is carried out as follows. The inside of the process chamber 201 is evacuated to a vacuum through the evacuation means 205. Subsequently, etching gas is introduced at a predetermined flow rate through the gas introducing means 204 into the process chamber. Then a conductance valve (not shown) set in the evacuation means 205 is adjusted to keep the inside of the process chamber 201 at a predetermined pressure. Desired power is supplied from the RF power supply 206 to the substrate holder 203. Electrons are accelerated by an RF electric field to generate a plasma in the process chamber 201. The plasma ionizes the etching gas, and ions produced thereby are accelerated by a self-bias electric field formed near the substrate 202 to impinge upon the surface of the substrate, thereby etching the surface.

It is, however, not easy for the conventional RIE apparatus to achieve discharge under low pressures of about $10^{-3}$ Torr, under which anisotropy of ion incidence directions can be maintained, and therefore, the conventional RIE apparatus is not effective in performing anisotropic etching of fine patterns. With increase of integration of devices demand is increasing for further making the patterns finer, but the conventional apparatus fails to meet this demand.

Another etching apparatus under research, replacing the RIE apparatus, is a plasma process apparatus utilizing electron cyclotron resonance (ECR), which can achieve discharge under the low-pressure condition of about $10^{-3}$ Torr. The ECR is a phenomenon that in the case of the magnetic flux density of 87.5 mT, the electron cyclotron frequency of electrons rotating around magnetic lines of force is coincident with the ordinary frequency of microwave 2.45 GHz whereby the electrons resonantly absorb the microwave to be accelerated, thereby generating a high-density plasma.

An ECR etching apparatus is shown in FIG. 3. In a process chamber 301 there are provided a holder 303 for a substrate 302 to be processed, and a gas introducing means 304. An RF power supply 306 is connected to the holder 303. The process chamber is evacuated by an evacuation means 305. Further, in the process chamber the microwave is introduced through a microwave introducing window 307 and a magnetic field can be generated by a magnetic field generating means 308.

Etching is carried out as follows. The inside of the process chamber 301 is evacuated to a vacuum through the evacuation means 305. Subsequently, the etching gas is introduced at a predetermined flow rate through the gas introducing means 304 into the process chamber 301. Then a conductance valve (not shown) set in the evacuation means 305 is adjusted to keep the inside of the process chamber 301 at a predetermined pressure. The magnetic field of 875 G is generated in the process chamber 301 by the magnetic field generating means 308 and microwave power is introduced through the microwave introducing window 307 into the process chamber 301 to generate a plasma. Electrons helically move around magnetic lines of force, and when the frequency of rotation of the electrons comes to coincide with the frequency (normally 2.45 GHz) of the microwave (in the case of the magnetic flux density 875 G), the electrons resonantly absorb the microwave to be accelerated. Further, the electrons ionize neutral molecules by bombardment, thereby forming a high-density plasma. When desired power is supplied from the RF power supply 306 to the support holder 303 at this time, the ions are accelerated by the self-bias electric field formed near the substrate 302 to impinge upon the surface of the substrate, thereby etching the surface.

Use of such ECR etching apparatus permits discharge to occur even under the low-pressure condition of about 1 mTorr, which enables anisotropic etching of fine patterns.

The ECR etching apparatus as shown in FIG. 3, however, is not easy to generate a uniform magnetic field, so that the apparatus has a problem of nonuniformity of etching and a problem of device destruction due to charge separation in a direction along the surface of the substrate. Because of high temperatures of electrons, in the case of processing of fine patterns with high aspect ratios, abnormal etching (notch) is also likely to be caused by charge separation in a direction along the depth of the substrate.

An object of the present invention is to provide a plasma process apparatus and method, solving the problems in the conventional plasma process apparatus as described above, that can generate a uniform plasma in high density and in a large area even under the low-pressure condition of about 1 mTorr without using the magnetic field, thereby enabling etching of large-area substrates in super fine patterns and at high speed.

SUMMARY OF THE INVENTION

A plasma process apparatus according to the present invention comprises a plasma process chamber, substrate-to-be-processed supporting means disposed in the process chamber, gas introducing means, evacuation means, microwave introducing means using an endless circular waveguide having a plurality of slots arranged around the process chamber, and RF power supplying means for supplying RF power to the substrate supporting means.

This arrangement permits the uniform plasma to be generated in high density and in a large area even under the low-pressure condition of about 1 mTorr without using the magnetic field, thereby enabling etching of large-area substrates in super fine patterns and at high speed.

DESCRIPTION OF THE PREFERRED EMBODIMENTS

Figure 1A:
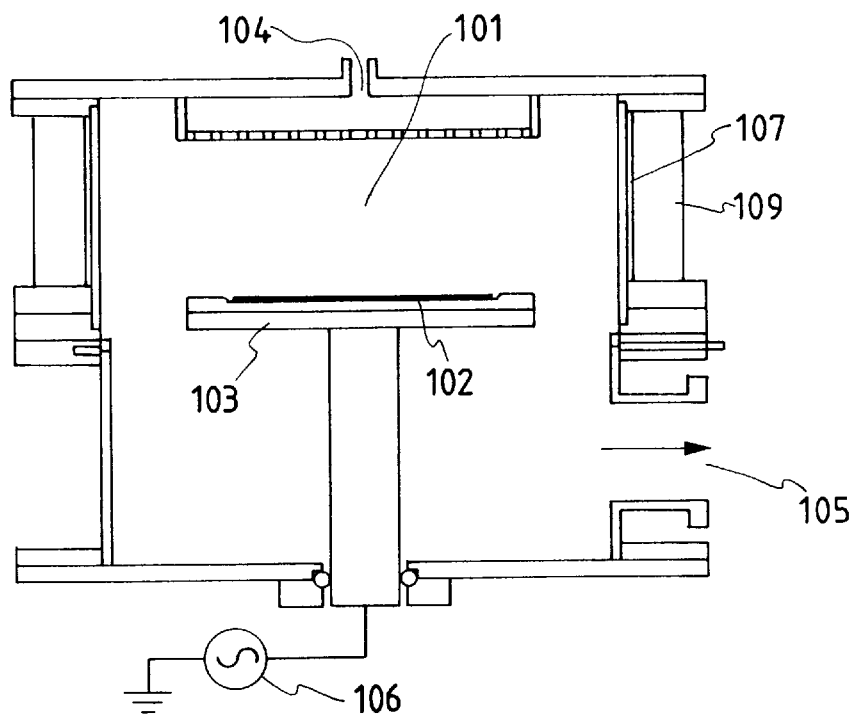
FIG. 1A is a schematic view showing the plasma processing apparatus according to the present invention.

A microwave plasma process apparatus of the present invention is shown in FIG. 1A. In a process chamber 101 there are provided a holder 103 for a substrate 102 to be processed, and a processing-gas introducing means 104. An RF power supply 106 is connected to the holder 103. The process chamber is evacuated by an evacuation means 105. Surrounding the process chamber, an endless circular multi-slot waveguide 109 is provided with intervention of a quartz tube 107.

Figure 1B:
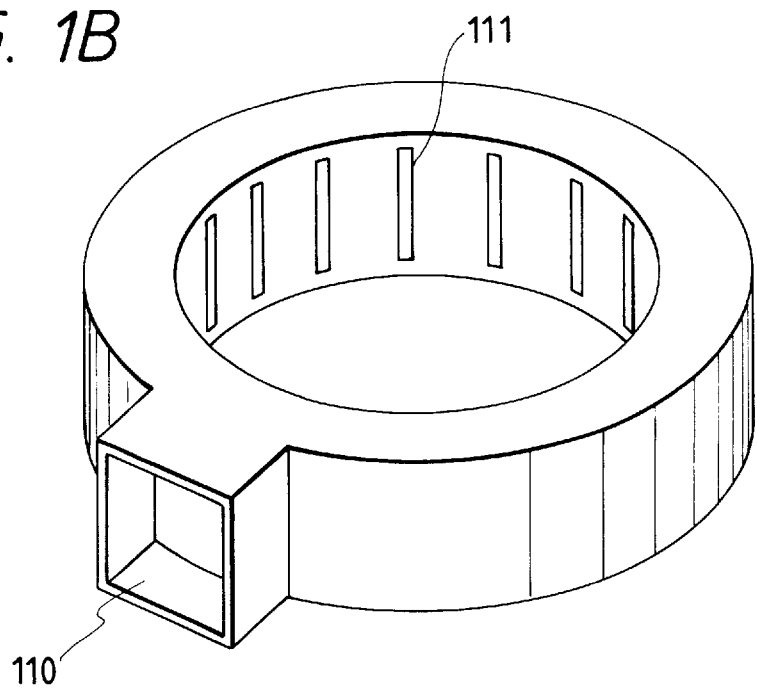
FIG. 1B is a schematic view showing the endless circular waveguide.
Figure 2:
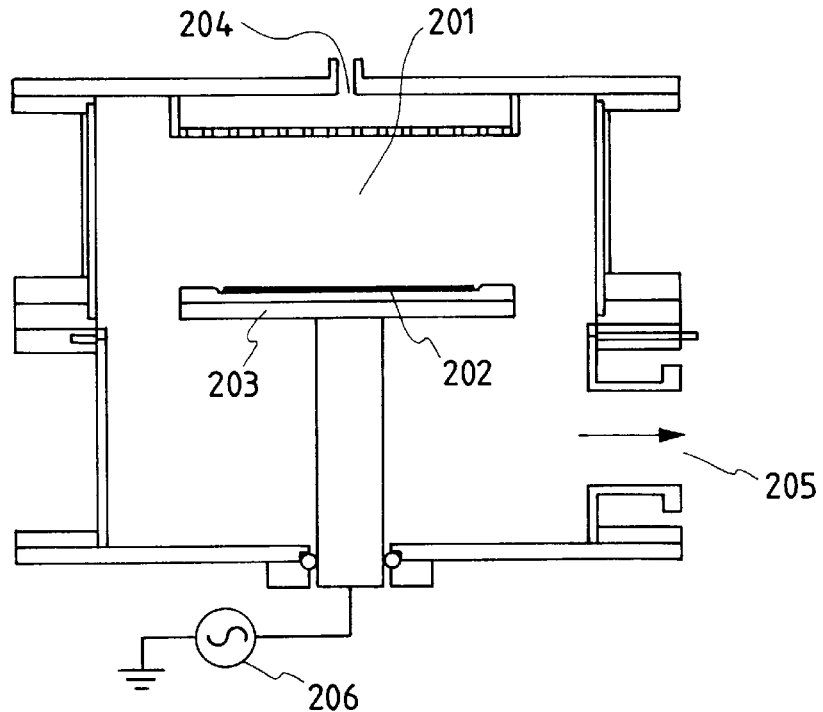
FIG. 2 is a schematic view showing the RIE apparatus as a conventional example.
Figure 3:
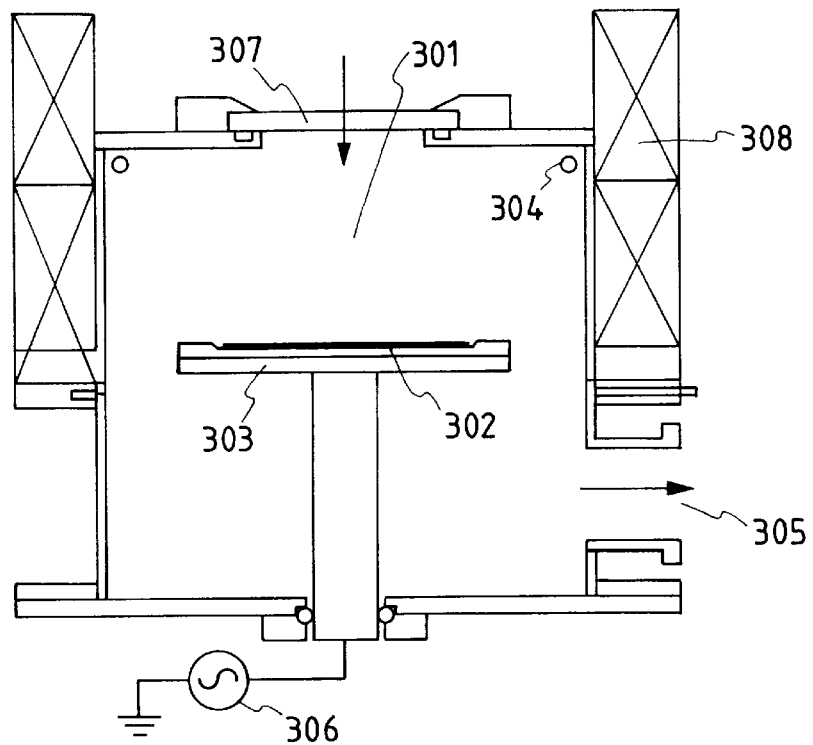
FIG. 3 is a schematic view showing the ECR etching apparatus as a conventional example.

The endless circular multi-slot waveguide 109 is shown in FIG. 1B. The microwave is guided through a microwave introducing portion 110 and is emitted through a plurality of slots 111 provided in the annular internal wall.

The process is carried out as follows. The inside of the process chamber 101 is evacuated to a vacuum through the evacuation means 105. Then the etching gas is introduced at a predetermined flow rate through the gas inlet port 104 into the process chamber 101. Next, a conductance valve (not shown) set in the evacuation means 105 is adjusted to keep the inside of the process chamber 101 at a predetermined pressure. Desired power is supplied from a microwave power supply (not shown) through the waveguide 109 into the process chamber 101, thereby generating a plasma. When the RF power is supplied from the RF power supply 106 to the substrate holder 103 at this time, ions are accelerated by the self-bias electric field formed near the substrate 102 to impinge upon the surface of the substrate, thereby etching the surface.

By using the endless circular multi-slot waveguide provided around the process chamber and the RF power supplying means for supplying the RF power to the support holder, the uniform plasma can be generated in high density and in a large area even under the low-pressure condition of about 1 mTorr without using the magnetic field, thereby enabling etching of the large-area substrate in ultra fine patterns and at high speed.

The microwave frequency used in the microwave plasma process apparatus of the present invention may be properly selected from the range of 0.8 GHz to 20 GHz.

The shape of the waveguide used in the plasma process apparatus of the present invention may be not only cylindrical, but also of any other shape, for example, of a disk or polygon, depending upon the configuration of the process chamber.

The plasma process apparatus of the present invention may further use a magnetic field generating means in addition to the above arrangement. Desired conditions of the magnetic field are those of the cusped magnetic field which has node planes lying on planes including the centers of the plural slots in the endless circular multi-slot waveguide and has magnetic lines of force substantially normal to the substrate supporting means and in which the magnetic flux density of the magnetic field near the slots is greater than that near the substrate.

The magnetic field generating means may be either a coil or a permanent magnet. In the case of the coil being used, a water cooling mechanism or any other cooling means such as air cooling means may be used in order to prevent overheat.

The pressure in the process chamber in the plasma process method of the present invention may be selected preferably from the range of 0.2 mTorr to 10.0 mTorr.

Thin films that can be processed by the plasma etching method of the present invention include electrically insulating films of $Si_3N_4$, $SiO_2$, $Ta_2O_5$, $TiO_2$, TiN, $Al_2O_3$, AlN, $MgF_2$, and so on; semiconductor films of a-Si (amorphous Si), poly-Si, SiC, GaAs, and so on; metal films of Al, W, Mo, Ti, Ta, and so on, etc., and the various thin films can be etched with efficiency.

The substrate to be processed by the plasma etching method of the present invention may be either one of semiconductor substrates, electrically conductive substrates, and electrically insulating substrates.

Specific examples of the electrically conductive substrates include metals such as Fe, Ni, Cr, Al, Mo, Au, Nb, Ta, V, Ti, Pt, and Pb; and alloys thereof, for example brass and stainless steel.

Specific examples of the electrically insulating substrates include various glasses such as $SiO_2$-based quartz; inorganic materials such as $Si_3N_4$, NaCl, KCl, LiF, $CaF_2$, $BaF_2$, $Al_2O_3$, AlN, and MgO; films and sheets of organic materials such as polyethylene, polyester, polycarbonate, cellulose acetate, polypropylene, polyvinyl chloride, polyvinylidene chloride, polystyrene, polyamide, and polyimide.

The etching gas used in the plasma etching method of the present invention may be selected from generally well-known gases. Specifically, depending upon the film or substrate to be etched, the etching gas may be selected from $F_2$, $CF_4$, $CH_2F_2$, $C_2F_6$, $CF_2Cl_2$, $SF_6$, and $NF_3$.

The plasma process apparatus and method of the present invention can also be applied to modification of surface, cleaning, resist ashing, or the like, as well as etching. For example, using Si, Al, Ti, Zn, or Ta as a substrate or surface layer, the substrate or surface layer of these can be subject to oxidation or nitriding or to doping with B, As, or P. Another application is a cleaning ashing process for removing organic materials including the resist, inorganic materials, and metal from the surface of the substrate.

For the surface process to oxidize the substrate, oxidizing gas may be selected from $O_2$, $O_3$, $H_2O$, NO, $N_2O$, and $NO_2$. For the surface process to nitride the substrate, nitriding gas may be selected from $N_2$, $NH_3$, $N_2H_4$, and hexamethyldisilazane (HMDS).

For the cleaning ashing of organic materials including the resist on the surface of the substrate, cleaning gas may be selected from $O_2$, $O_3$, $H_2O$ NO, $N_2O$, and $NO_2$. For the cleaning of the inorganic materials and metal on the surface of the substrate, cleaning gas may be selected from $F_2$, $CF_4$, $CH_2F_2$, $C_2F_6$, $CF_2Cl_2$, $SF_6$, and $NF_3$.

EXAMPLES

The plasma process apparatus and method of the present invention will be described more specifically with examples, but it is noted that the present invention is by no means intended to be limited to these examples.

Example 1

Using the plasma process apparatus shown in Fig. 1A, etching was carried out on a polysilicon film between the gate electrodes of semiconductor device.

The substrate 102 used herein was a p-type single-crystal silicon substrate (face orientation <100> and resistivity 10 Ωcm) with a polysilicon film formed as an uppermost layer. First, after the silicon substrate 102 was set on the substrate holder 103, the inside of the process chamber 101 was evacuated to a vacuum through the evacuation system 105, so as to decrease the pressure down to the value of $10^{-6}$ Torr.

Through the gas inlet port 104 CF$_4$ gas and oxygen were introduced at 300 sccm and at 20 sccm, respectively, into the process chamber 101. Then the conductance valve (not shown) set in the evacuation system 105 was adjusted to keep the inside of the process chamber 101 at 1.0 mTorr. Then the RF wave of 13.56 MHz was applied from the RF power supply 106 to the substrate holder 103, and the power of 1.5 kW was supplied from the microwave power supply of 2.45 GHz through the circular waveguide 109 into the process chamber 101. In this way the plasma was generated in the process chamber 101. The CF$_4$ gas and oxygen introduced through the gas inlet port 104 were excited and decomposed in the process chamber 101 to become active species. The active species were transported toward the silicon substrate 102 and the ions accelerated by the self-bias etched the polysilicon film.

After etching, evaluation was carried out as to the etching rate, etch selectivity, and etching shape. The etching shape was evaluated by observing cross sections of the etched polysilicon film by a scanning electron microscope (SEM). The results confirmed that the etching rate and etch selectivity over SiO$_2$ were good as 600 nm/min and 30, respectively, and that the microloading effect was little.

Example 2

Using the plasma process apparatus shown in FIG. 1A, etching was conducted on a BPSG (Boron-doped Phospho-Silicate Glass) film of semiconductor device.

The substrate 102 used herein was a p-type single-crystal silicon substrate (face orientation <100> and resistivity 10 Ωcm) with a BPSG film 1 μm thick formed on polysilicon pattern (lines and spaces of 0.5 μm). First, after the silicon substrate 102 was set on the substrate holder 103, the inside of the process chamber 101 was evacuated to a vacuum through the evacuation system 105, so as to decrease the pressure down to the value of 10$^{-6}$ Torr. Then CF$_4$ was introduced at the flow rate of 300 sccm through the gas inlet port 104 into the process chamber 101. Then the conductance valve (not shown) set in the evacuation system 105 was adjusted to keep the inside of the process chamber 101 at 1.2 mTorr. Then the power of 2.0 kW was supplied from the microwave power supply of 2.45 GHz through the circular waveguide 109 into the process chamber 101. In this way the plasma was generated in the process chamber 101. The CF$_4$ gas introduced through the gas inlet port 104 was excited and decomposed in the process chamber 101 to become an active species. The active species was transported toward the silicon substrate 102 to etch the BPSG film.

After etching, evaluation was carried out as to the etching rate, etch selectivity, and etching shape. The etching shape was evaluated by observing cross sections of the etched BPSG film by the scanning electron microscope (SEM). The results confirmed that the etching rate and etch selectivity over polysilicon were good as 300 nm/min and 30, respectively, that the etching shape was almost vertical, and that the microloading effect was little.

Example 3

Using the plasma process apparatus shown in FIG. 1A, etching was effected on an Al film of multi-layer wiring of semiconductor device.

The substrate 102 used herein was a p-type single-crystal silicon substrate (face orientation <100> and resistivity 10 Ωcm) with an Al film formed as an uppermost layer. First, after the silicon substrate 102 was set on the substrate holder 103, the inside of the process chamber 101 was evacuated to a vacuum through the evacuation system 105, so as to decrease the pressure down to the value of 10$^{-6}$ Torr. Then Cl$_2$ gas and gasified BCl$_3$ were introduced at 120 sccm and at 80 sccm, respectively, through the gas inlet port 104 into the process chamber 101. Then the conductance valve (not shown) set in the evacuation system 105 was adjusted to keep the inside of the process chamber 101 at 0.8 mTorr. Then the RF wave of 13.56 MHz was applied from the RF applying means 106 to the substrate holder 103 and the power of 1.2 kW was supplied from the microwave power supply of 2.45 GHz through the circular waveguide 109 into the process chamber 101. In this way the plasma was generated in the process chamber 101. The Cl$_2$ gas and BCl$_3$ introduced through the gas inlet port 104 were excited and decomposed in the process chamber 101 to become active species. The active species were transported toward the silicon substrate 102, so that the ions accelerated by the self-bias etched the Al film.

After etching, evaluation was carried out as to the etching rate, etch selectivity, and etching shape. The etching shape was evaluated by observing cross sections of the etched Al film by the scanning electron microscope (SEM). The results confirmed that the etching rate and etch selectivity over SiO$_2$ were good as 500 nm/min and 20, respectively, that the etching shape was vertical, and that the microloading effect was little.

Example 4

Using the plasma process apparatus shown in Fig. 1A, etching was effected on an Al film of wiring of liquid crystal display element.

The substrate 102 used herein was a blue plate glass substrate of 450 mm×550 mm with an Al film formed as an uppermost layer. First, after the glass substrate 102 was set on the substrate holder 103, the inside of the process chamber 101 was evacuated to a vacuum through the evacuation system 105, so as to decrease the pressure down to the value of 10$^{-6}$ Torr. Then Cl$_2$ gas was introduced at the flow rate of 200 sccm through the gas inlet port 104 into the process chamber 101. Then the conductance valve (not shown) set in the evacuation system 105 was adjusted to keep the inside of the process chamber 101 at 2.0 mTorr. Then the RF wave of 13.56 MHz was applied from the RF applying means 106 to the substrate holder 103 and the power of 2.0 kW was supplied from the microwave power supply of 2.45 GHz through the circular waveguide 109 into the process chamber 101. In this way the plasma was generated in the process chamber 101. The Cl$_2$ gas introduced through the gas inlet port 104 was excited and decomposed in the process chamber 101 to become an active species. The active species was transported toward the glass substrate 102, so that the ions accelerated by the self-bias etched the Al film.

After etching, evaluation was carried out as to the etching rate, etch selectivity, and etching shape. The etching shape was evaluated by observing cross sections of the etched Al film by the scanning electron microscope (SEM). The results confirmed that the etching rate and etch selectivity over SiO$_2$ were good as 500 nm/min and 25, respectively, and that the etching shape was vertical.

Example 5

Using the plasma process apparatus shown in FIG. 1A, etching was carried out on a glass substrate for phase grating filter of copier optical system.

The substrate 102 used herein was a white plate glass substrate. First, after the glass substrate 102 was set on the substrate holder 103, the inside of the process chamber 101 was evacuated to a vacuum through the evacuation system 105, so as to decrease the pressure down to the value of $10^{-6}$ Torr. Then $CF_4$ and $H_2$ were introduced at 200 sccm and at 40 sccm, respectively, through the gas inlet port 104 into the process chamber 101. Then the conductance valve (not shown) set in the evacuation system 105 was adjusted to keep the inside of the process chamber 101 at 1.2 mTorr. Then the RF wave of 13.56 MHz was applied from the RF applying means 106 to the substrate holder 103 and the power of 2.2 kW was supplied from the microwave power supply of 2.45 GHz through the circular waveguide 109 into the process chamber 101. In this way the plasma was generated in the process chamber 101. The $CF_4$ gas and $H_2$ introduced through the gas inlet port 104 were excited and decomposed in the process chamber 101 to become active species. The active species were transported toward the glass substrate 102, so that the ions accelerated by the self-bias etched the glass substrate.

After etching, evaluation was carried out as to the etching rate and etching shape. The etching shape was evaluated by observing cross sections of the etched glass substrate by the scanning electron microscope (SEM). The results confirmed that the etching rate was good as 450 nm/min and that the etching shape was vertical.

What is claimed is:

1. A plasma processing apparatus comprising:

a plasma process chamber;

a substrate supporting means for supporting a substrate in said plasma process chamber;

a gas introducing means for introducing an etching processing gas into said plasma process chamber, wherein said gas introducing means is provided in opposition to a surface of said substrate;

a microwave introducing means comprising a circular waveguide with a plurality of slots, said circular waveguide being arranged to provide a space between said surface of said substrate, said gas introducing means, and said circular waveguide in said process chamber, and a radio frequency power supplying means for supplying radio frequency power to said substrate supporting means, wherein a wall surface of said circular waveguide is arranged perpendicular to said surface of said substrate and perpendicular to a gas discharging surface of said gas introducing means, and wherein a plasma of the gas is generated in the space in said process chamber between said gas introducing means, said surface of said substrate and said circular waveguide.

2. The microwave plasma process apparatus according to claim 1, further comprising magnetic field generating means for generating a magnetic field.

3. The microwave plasma process apparatus according to claim 2, wherein said magnetic field is substantially normal to said substrate to be processed.

4. The microwave plasma process appartus according to claim 1, wherein the etching gas is one selected from the group consisting of $F_2$, $CF_4$, $CH_2F_2$, $C_2F_6$, $CF_2Cl_2$, $SF_6$, and $NF_3$.

5. The plasma processing apparatus according to claim 1, wherein said circular waveguide is an endless circular waveguide.

* * * * *

UNITED STATES PATENT AND TRADEMARK OFFICE
CERTIFICATE OF CORRECTION

PATENT NO.   : 5,983,829
DATED        : November 16, 1999
INVENTOR(S)  : NOBUMASA SUZUKI It is certified that error appears in the above-identified patent and that said Letters Patent is hereby corrected as shown below:

ON THE TITLE PAGE item [56] References Cited, under FOREIGN PATENT DOCUMENTS:
"5345982 12/1993 Japan" should be deleted.

item [57] Abstract:
Line 13, "super fine" should read --super-fine--.

COLUMN 1:

Line 8,  "super fine" should read --super-fine--;
Line 43, "increase" should read --the increase--; and
         "devices" should read --devices,--;
Line 44, "further" should be deleted; and
Line 54, "GHz" should read --GHz,--.

COLUMN 2:

Line 26, "The" should read --With the--;
Line 27, "is" should read --it is--;
Line 41, "super fine" should read --super-fine--; and
Line 58, "super fine" should read --super-fine--.

COLUMN 3:

Line 64, "overheat." should read --overheating.--.

COLUMN 4:

Line 6,  "etc., and the" should read --etc. The--; and
Line 60, "semiconductor" should read
         --a semiconductor--.

UNITED STATES PATENT AND TRADEMARK OFFICE
CERTIFICATE OF CORRECTION

PATENT NO.   :   5,983,829

DATED        :   November 16, 1999

INVENTOR(S)  :   NOBUMASA SUZUKI

It is certified that error appears in the above-identified patent and that said Letters Patent is hereby corrected as shown below:

COLUMN 5:

Line 22, "as" should read --at--;
    Line 23, "little." should read --small.--;
    Line 28, "semiconductor" should read
         --a semiconductor--;
    Line 55, "as" should read --at--; and
    Line 57, "little." should read --small.--.

COLUMN 6:

Line 25, "as" should read --at--;
    Line 27, "little." should read --small.--;
    Line 66, "phase" should read --a phase--; and
    Line 67, "copier" should read --a copier--.

UNITED STATES PATENT AND TRADEMARK OFFICE
CERTIFICATE OF CORRECTION

PATENT NO.   :  5,983,829
DATED        :  November 16, 1999
INVENTOR(S)  :  NOBUMASA SUZUKI It is certified that error appears in the above-identified patent and that said Letters Patent is hereby corrected as shown below:

<u>COLUMN 7</u>:

Line 26, "as" should read --at--.

Signed and Sealed this

Twenty-seventh Day of March, 2001

Attest:

Attesting Officer

NICHOLAS P. GODICI

Acting Director of the United States Patent and Trademark Office